US006005436A

United States Patent [19]

Shibayama et al.

[11] Patent Number: 6,005,436

[45] Date of Patent: *Dec. 21, 1999

[54] INTERNAL REDUCED-VOLTAGE GENERATOR FOR SEMICONDUCTOR INTEGRATED CIRCUIT

[75] Inventors: Akinori Shibayama; Toshio Yamada, both of Osaka, Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/857,648

[22] Filed: May 16, 1997

Related U.S. Application Data

[60] Continuation of application No. 08/593,555, Jan. 30, 1996, abandoned, which is a division of application No. 08/132, 322, Oct. 6, 1993, Pat. No. 5,554,953.

[30] Foreign Application Priority Data

Oct. 7, 1992 [JP] Japan .................................. 4-268490

[51] Int. Cl.[6] ...................................................... G11C 7/00

[52] U.S. Cl. .......................... 327/546; 327/545; 365/229

[58] Field of Search ............................ 327/78, 407, 545, 327/546; 365/222, 227, 228, 229

[56] References Cited

U.S. PATENT DOCUMENTS

| | | | |
|---|---|---|---|
| 4,617,473 | 10/1986 | Bingham | 327/546 |
| 4,654,829 | 3/1987 | Jiang et al. | 365/229 |
| 4,683,382 | 7/1987 | Sakurai et al. | 365/227 |
| 4,945,267 | 7/1990 | Galbraith | 327/434 |
| 5,043,605 | 8/1991 | Gabara | 326/73 |
| 5,140,183 | 8/1992 | Takenaka | 327/543 |
| 5,272,393 | 12/1993 | Horiguchi et al. | 327/543 |
| 5,297,098 | 3/1994 | Nakatani et al. | 365/226 |
| 5,306,961 | 4/1994 | Leo | 327/546 |
| 5,323,354 | 6/1994 | Matsumoto et al. | 365/229 |
| 5,337,282 | 8/1994 | Koike | 365/222 |
| 5,367,487 | 11/1994 | Yoshida | 365/222 |
| 5,426,616 | 6/1995 | Kajigaya et al. | 327/544 |
| 5,493,234 | 2/1996 | Oh | 326/33 |

OTHER PUBLICATIONS

IBM Technical Disclosure Bulletin—"Circuit Allowing Installation and Removal of a Device under Power", Sep. 1994, pp. 315–316.

*Primary Examiner*—Terry D. Cunningham
*Attorney, Agent, or Firm*—McDermott, Will & Emery

[57] ABSTRACT

A reference voltage generator is composed of a first constant-voltage generator consisting of three p-type MOS transistors for generating a first reference voltage Vref for use in the normal operation, which is independent of an external power-supply voltage VCC and of a second constant-voltage generator consisting of two p-type MOS transistors and one n-type MOS transistor for generating a second reference voltage Vrefbi for use in a burn-in acceleration test, which is dependent on VCC. The output of each of the constant-voltage generators is feedbacked to the other constant-voltage generator as its input. Two differential amplifiers and two output drivers output, as an internal reduced voltage Vint, the higher one of Vref and Vrefbi which are outputted from the reference voltage generator. Since Vint is generated based on the two outputs Vref and Vrefbi which are outputted from the single reference voltage generator and which are related to each other, the power consumption and layout area of an internal reduced-voltage generator, which is suitable for the burn-in, can be reduced.

7 Claims, 11 Drawing Sheets

30

40

INTERNAL REDUCED-VOLTAGE GENERATOR FOR SEMICONDUCTOR INTEGRATED CIRCUIT

This is a file wrapper continuation of Ser. No. 08/593,555, Jan. 30, 1996, now abandoned which is a divisional application of Ser. No. 08/132,322, filed Oct. 6, 1993, now U.S. Pat. No. 5,554,953, issued Sep. 10, 1996.

BACKGROUND OF THE INVENTION

The present invention relates to an internal reduced-voltage generator to be mounted in a semiconductor integrated circuit such as a dynamic random access memory (DRAM).

In recent years, semiconductor integrated circuits in which internal reduced-voltage generators are mounted have vigorously been developed for the purposes of decreasing their power consumption and of ensuring the reliability of their internal elements. In these semiconductor integrated circuits, the internal reduced-voltage generator generates an internal reduced voltage based on an external power-supply voltage VCC so that the internal elements thereof are supplied with the internal reduced voltage. For example, the circuit disclosed in Japanese Laid-Open Patent Publication No. 63-244217 provides an internal reduced voltage which is less dependent on VCC.

In Japanese Laid-Open Patent Publication No. 64-13292, on the other hand, there is disclosed a DRAM provided with a self-refreshment function for use on the occasion of battery back up that requires a power-saving operation. In the DRAM, the switching from the normal operation mode to a self-refreshment mode is carried out by the application of a RAS (row address strobe) and CAS (column address strobe) with a specified timing. To drive its internal elements, however, the conventional DRAM uses the same voltage in the self-refreshing period, which requires the power-saving operation, as that used in the normal operation.

There is also proposed a voltage limiter for use in a DRAM which is suitable for burn-in (M. Horiguchi et al., Technical Report of IEICE, ICD91–129, 1991, pp. 25–32). With the voltage limiter, an internal reduced voltage is stably provided in the normal operation and, by simply raising VCC, a voltage to be used in a burn-in acceleration test, which is higher than the foregoing internal reduced voltage, is automatically supplied to the internal elements. To perform this function, the voltage limiter comprises a first reference voltage generator for generating the internal reduced voltage to be used in the normal operation (VRN regulator), first trimmer for adjusting the internal reduced voltage, second reference voltage generator for generating the higher voltage to be used in the burn-in acceleration test (VRB regulator), and second trimmer for adjusting the higher voltage.

Since the internal elements of the conventional DRAMs are operated, even in the self-refreshing period, with the same voltage used in the normal operation, it is impossible to sufficiently reduce the power consumption of the DRAMs during the battery back up.

Moreover, since the aforesaid voltage regulator comprises the two independent circuits for generating the two different reference voltages, the power consumption and layout area of the DRAM in which the voltage regulator is mounted are thereby increased. Furthermore, the provision of the two trimmers has spurs that increase power consumption and layout area.

SUMMARY OF THE INVENTION

An object of the present invention is to reduce the power consumption and layout area of an internal reduced-voltage generator for a semiconductor integrated circuit which is suitable for burn-in.

Another object of the present invention is to reduce the power consumption of a semiconductor integrated circuit in an operation mode that requires power saving.

In order to achieve the above first object, the present invention has adopted a constitution in which an internal reduced voltage is generated based on the two outputs of a single reference voltage generator comprising two constant-voltage generators, so that the output of each of the two constant-voltage generators is fed-backed to the other constant-voltage generator as its input. With the constitution, the internal reduced voltage for use in the normal operation and a higher voltage for use in a burn-in acceleration test are obtained on the basis of a first reference voltage which is independent of an external power-supply voltage and a second reference voltage which is dependent on the external power-supply voltage, each being output from the single reference voltage generator. Moreover, since the output of each of the two constant-voltage generators are fed-backed to the other constant-voltage generator as its input so that the first and second reference voltages are related to each other, the first and second reference voltages can be corrected simultaneously by means of a single trimmer means.

It is also possible to adopt a constitution in which two internal reduced voltages are output from a single internal reduced-voltage generator. With the constitution, it becomes possible to use the two internal reduced voltages, each of which assumes the burn-in acceleration test, in a single semiconductor integrated circuit.

In order to achieve the above second object, the present invention has adopted a constitution in which, in the case of adopting an operation mode that requires power saving, such as a self-refreshment mode, in a semiconductor integrated circuit, the supply voltage to its internal elements is lowered compared to that used in the normal operation mode.

DETAILED DESCRIPTION OF THE PREFERRED EMBODIMENTS

Figure 1:
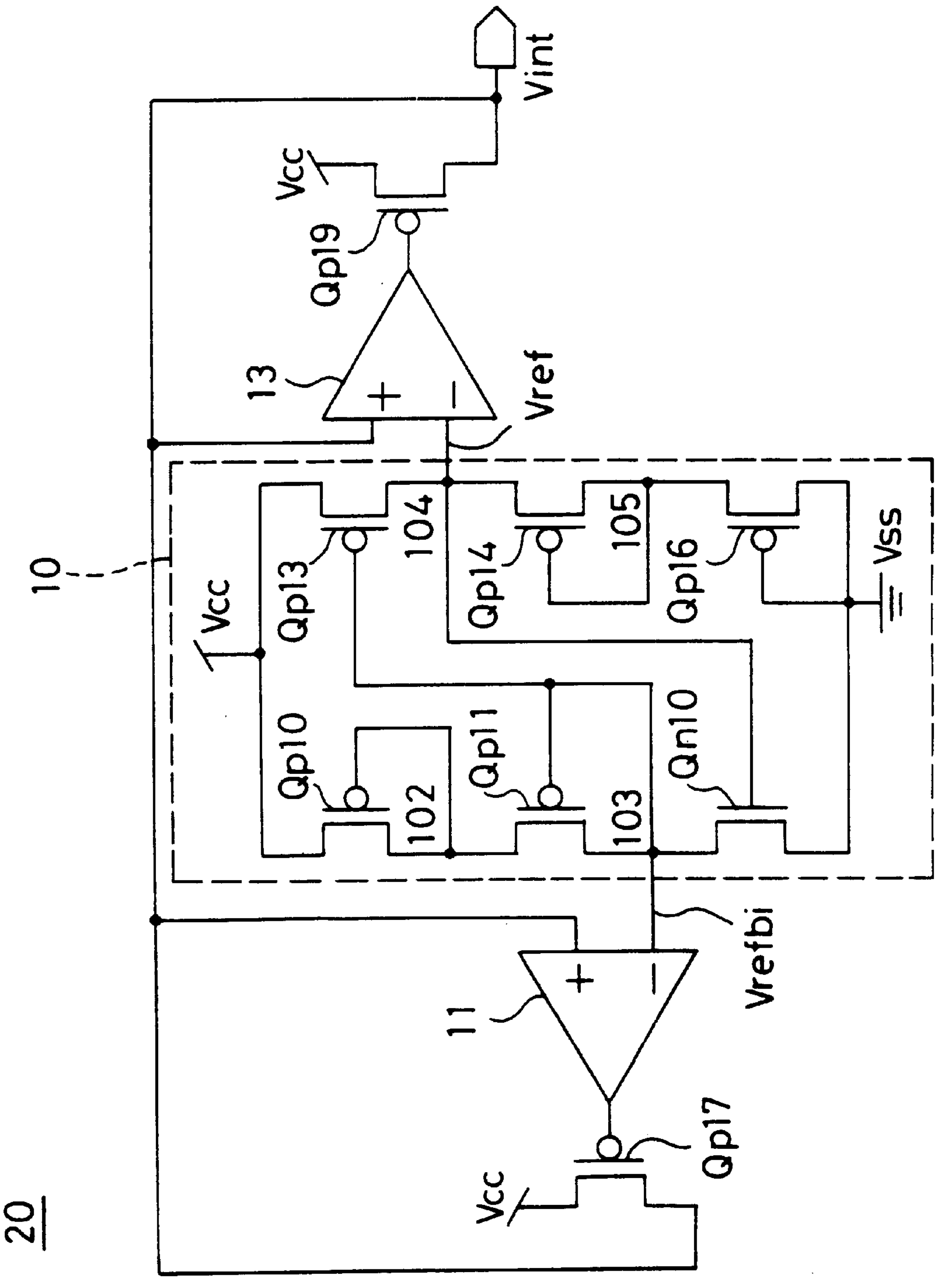
FIG. 1 is a circuit diagram of an internal reduced-voltage generator for use in a DRAM according to a first embodiment of the present invention.

Referring now to the drawings, embodiments of an internal reduced-voltage generator and of a DRAM in which is mounted the internal reduced-voltage generator according to the present invention will be described below.

EXAMPLE 1

FIG. 1 is a circuit diagram of the internal reduced-voltage generator for use in the DRAM according to a first embodiment of the present invention. In the drawing, an internal reduced-voltage generator 20 is for outputting an internal reduced voltage Vint as the supply voltage to the internal elements of a DRAM and comprises a reference voltage generator 10, two differential amplifiers 11 and 13, and two p-type MOS transistors Qp17 and Qp19 as output drivers. The reference voltage generator 10 generates a reference voltage Vref (first reference voltage) for use in the normal operation and a reference voltage Vrefbi (second reference voltage) for use in a burn-in acceleration test. The first differential amplifier 11 uses Vrefbi as the first input and Vint as the second input. The second differential amplifier 13 uses Vref as the first input and Vint as the second input. The gate of Qp17 and the gate of Qp19 are controlled by the outputs of the first and second differential amplifiers 11 and 13, respectively. Here, VCC and VSS represent an external power-supply voltage and a ground voltage, respectively.

The reference voltage generator 10 is of CMOS structure for generating Vref which is less dependent on VCC and for generating Vrefbi which is dependent on VCC. Specifically, in a direction from VSS to VCC, two p-type transistors Qp16 and Qp14 constitute constant voltage sources (MOS diodes), respectively, and a p-type MOS transistor Qp13 constitutes a constant current source, so as to generate the first reference voltage Vref which is independent of VCC but dependent on VSS. In a direction from VCC to VSS, two p-type MOS transistors Qp10 and Qp11 constitute constant voltage sources (MOS diodes), respectively, and a n-type MOS transistor Qn10 constitutes a constant current source, so as to generate the second reference voltage Vrefbi which is independent of VSS but dependent on VCC. Here, each of Qp10, Qp11, Qp14, and Qp16 forms a diode which has its gate and drain short-circuited. The gate of Qn10 and the source of Qp14 are short-circuited, while the gate of Qp13 and the drain of Qp11 are short-circuited. Each of Qp10, Qp11, Qp13, Qp14, Qp16, and Qn10 is operated in a saturation region. In the drawing, 103 denotes a node for outputting Vrefbi, 104 denotes a node for outputting Vref, 102 denotes a node for connecting Qp10 and Qp11, and 105 denotes a node for connecting Qp14 and Qp16.

Below, the principle of the operation of the reference voltage generator 10 will be described briefly. Provided that Vref is substantially constant, the gate potential of Qn10, which is operated in the saturation region, is a constant value Vref and its source potential is VSS. Therefore, the gate-source voltage of Qn10 is kept substantially constant, with the result that Qn10 is operated as the constant current source and the drain current Idn10 of Qn10 is kept substantially constant. The drain potential of Qp11 (equal to the gate potential thereof) when the respective drain currents Idp10, Idp11, and Idn10 of Qp10, Qp11, and Qn10 are the same serves as Vrefbi in a stable state. Consequently, Idp10 and Idp11 in the stable state are substantially constant. On the other hand, since Qp10 and Qp11, each being operated in the saturation region, are diodes composed of MOS transistors having their gates and drains short-circuited, respectively, each of Idp10 and Idp11 is practically determined by the gate-source voltage of its corresponding transistor. When Idp10 and Idp11 are substantially constant, as described above, the gate-source voltage of each of Qp10 and Qp11 is also kept substantially constant. From the foregoing, it can be concluded that the potential difference between Vrefbi and VCC (equal to the potential difference between the source of Qp10 and the gate of Qp11) is substantially constant.

Since the gate-source voltage of Qp13 equals to the potential difference between Vrefbi and VCC and hence is kept substantially constant, Qp13 being operated in the saturation region serves as the constant current source, which means that the drain current Idp13 of Qp13 is kept substantially constant even when VCC is varied. The source potential of Qp14 when the respective drain currents Idp13, Idp14, and Idp16 of Qp13, Qp14, and Qp16 are the same serves as Vref in the stable state. Consequently, Idp14 and Idp16 in the stable state are kept substantially constant. On the other hand, since Qp14 and Qp16, each being operated in the saturation region, are diodes composed of MOS transistors having their gates and drains short-circuited, respectively. each of Idp14 and Idp16 is practically determined by the gate-source voltage of its corresponding transistor. When Idp14 and Idp16 are substantially constant. as described above, the gate-source voltage of each of Qp14 and Qp16 is kept substantially constant. From the foregoing, it can be concluded that the potential difference between Vref and VSS (equal to the potential difference between the source of Qp14 and the gate of Qp16) is substantially constant.

As described above, in the reference voltage generator 10 of the feedback structure shown in FIG. 1, Vrefbi is lower than VCC by a specified potential difference, so as to provide a constant reference voltage which is independent of VSS but dependent on VCC. Conversely, Vref is higher than VSS by a specified potential difference, so as to provide a constant reference voltage which is independent of VCC but dependent on VSS.

In the case where all the six MOS transistors constituting the reference voltage generator 10 are operated in the saturation region, the following equation (1) is valid:

$$Vref=-(2\sqrt{\beta p1}*(\sqrt{\beta p3}+\sqrt{\beta p4})/(\sqrt{(\beta p1*\beta p4)}-4\sqrt{(\beta n0+\beta p3)}))Vtp-(4\sqrt{(\beta n0*\beta p3)}/(\sqrt{(\beta p1*\beta p4)}-4\sqrt{(\beta n0+\beta p3)}))Vtn+VSS \quad (1)$$

wherein $\beta p0$, $\beta p1$, $\beta p3$, $\beta p4$, $\beta p6$, and $\beta n0$: respective gain coefficients of Qp10, Qp11, Qp13, Qp14, Qp16, and Qn10; Vtp: threshold voltage of a p-type MOS transistor; and Vtn: threshold voltage of an n-type MOS transistor.

For simplification, it is supposed that the respective threshold voltages of the p-type MOS transistors are the same, and that $\beta p0=\beta p1$ and $\beta p4=\beta p6$ are substituted in the equation (1) so that the equation (1) does not contain $\beta p0$ and $\beta p6$. The expression of Vrefbi is omitted here.

Next, the operations of the differential amplifiers 11 and 13 and output drivers Qp17 and Qp19 of FIG. 1 will be described. When Vint becomes lower than Vrefbi, the output voltage of the differential amplifier 11 drops to turn Qp17 on, so that Vint is increased. When Vint has reached Vrefbi, the output voltage of the first differential amplifier 11 rises to turn Qp17 off. Consequently, Vint is increased to the same value of Vrefbi. Similarly, by the operations of the differential amplifier 13 and Qp19, Vint is increased to the same value of Vref. Namely, Vint is increased to the higher value of Vref and Vrefbi.

Figure 3:
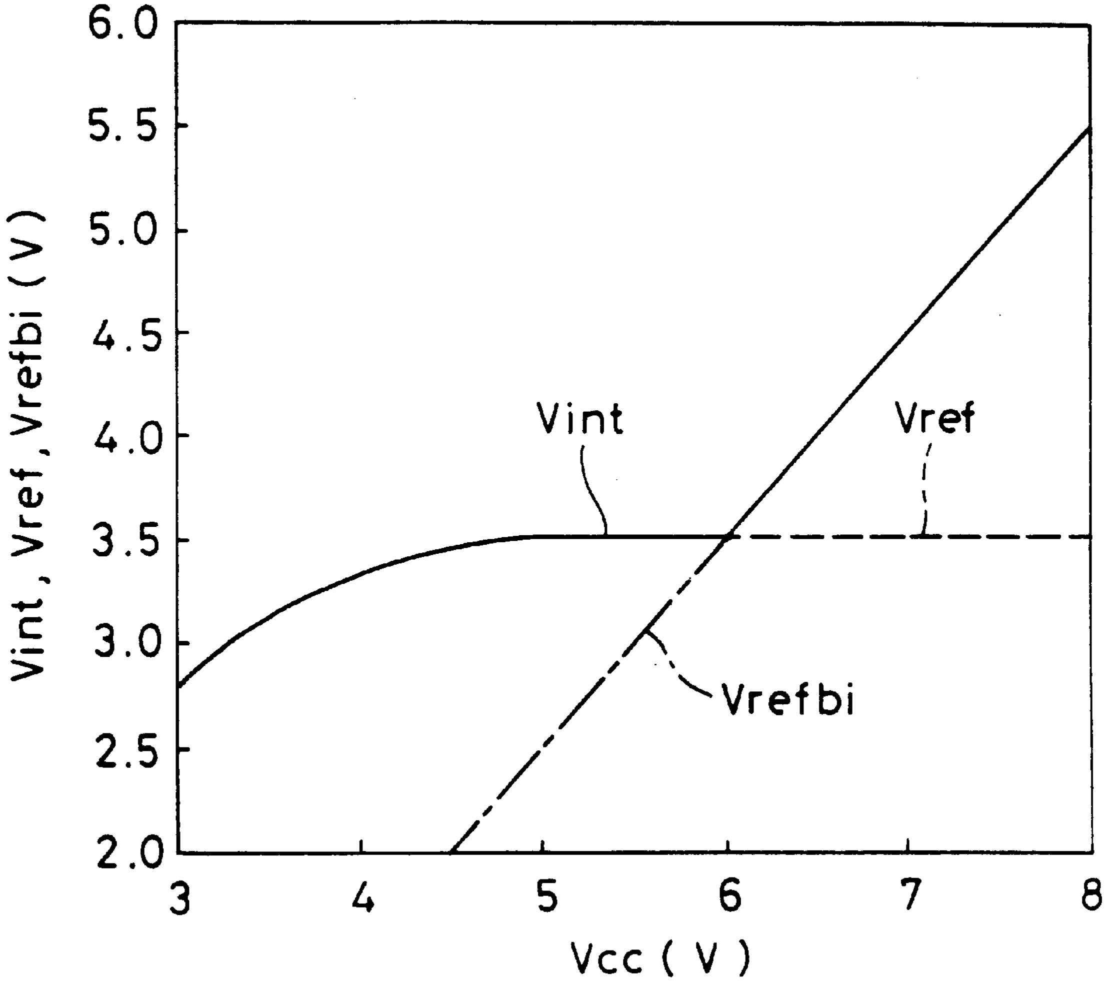
FIG. 3 is a characteristic graph showing the dependency of an internal reduced voltage from the circuit of FIG. 1 on an external power-supply voltage.

FIG. 3 is a graph showing the dependency of Vint on an external power-supply voltage in the internal reduced-voltage generator 20 mentioned above. The difference between Vref and VSS and the difference between Vrefbi and VCC are set to desired values, respectively. Since Vref is set higher than Vrefbi in a range in which VCC is lower than 6 V (containing a specified VCC range of 4.5 V to 5.5 V in the normal operation of the DRAM), Vint becomes equal to Vref which is independent of VCC. However, since Vrefbi is set higher than Vref in a range in which VCC is 6 V or higher (the VCC range in the burn-in acceleration test on the DRAM), Vint becomes equal to Vrefbi which is dependent on VCC. With Vint which is dependent on VCC, the stress on the internal elements of the DRAM can be decreased.

Figure 2:
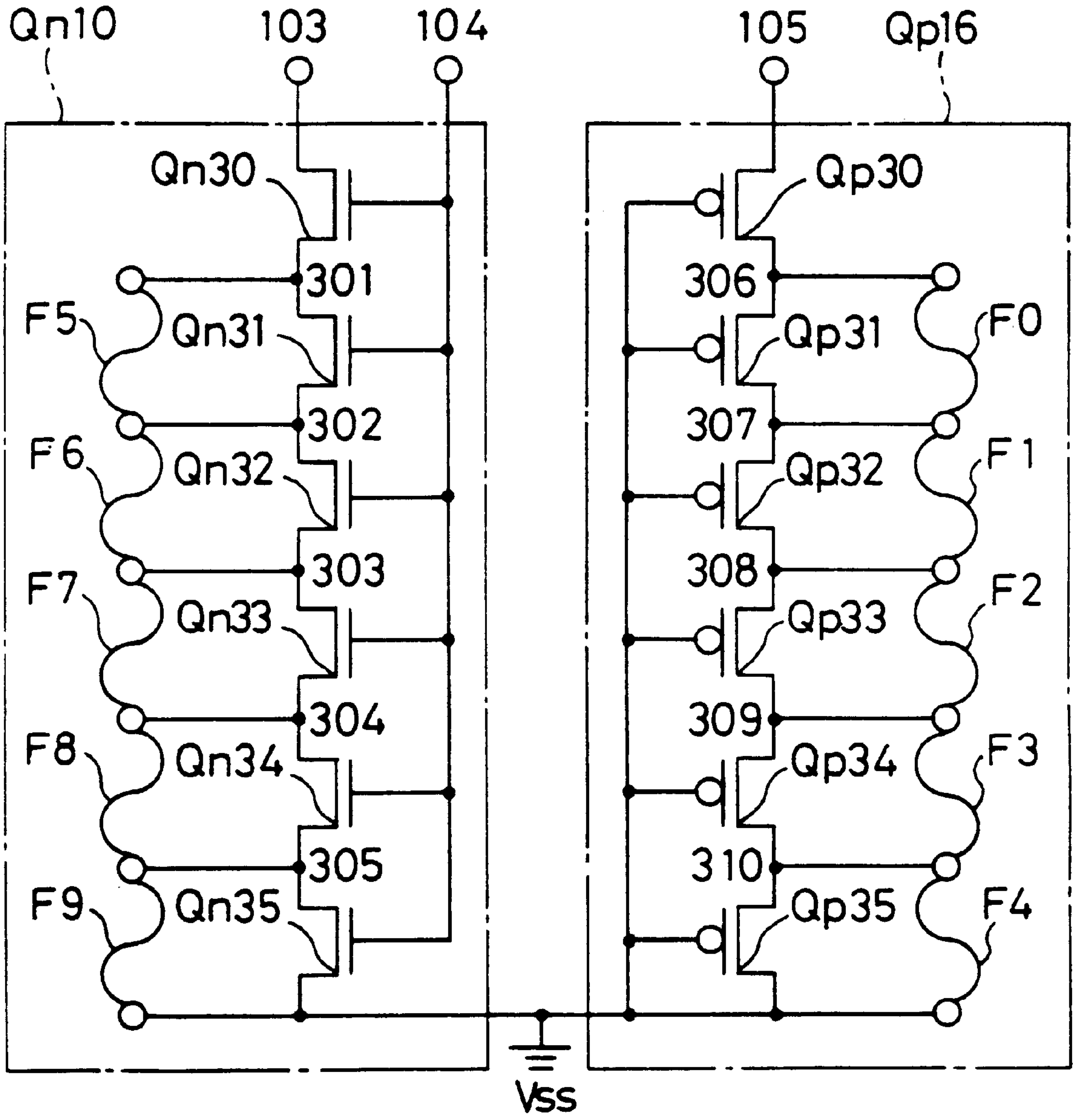
FIG. 2 is a circuit diagram of a trimmer for use in the internal reduced-voltage generator of FIG. 1.

As is apparent from the equation (1), the variations in Vref and hence in Vint result from the variations in threshold voltage and other factors which are generated in the fabrication process of the DRAM. FIG. 2 is a view showing, by way of example, the structure of a trimmer (fuse ROM) for adjusting Vint. In the drawing, Qp16 consists of six p-type MOS transistors Qp3O to Qp35 connected in series, Qn10 consists of six n-type MOS transistors Qn30 to Qn35 connected in series, F0 to F4 are fuses disposed between the sources and drains of Qp 31 to Qp35, respectively, and F5 to F9 are fuses disposed between the sources and drains of Qn 31 to Qn35, respectively. If at least one of F5 to F9 is cut out, the channel length of Qp16 is altered equivalently. Here, 301 to 310 denote the nodes for connecting the transistors.

As expressed in the equation (1), Vref is dependent on the gain coefficient β of each of the MOS transistors constituting the reference voltage generator 10. The gain coefficient β is expressed by the following equation (2):

$$\beta=\mu*Cox*W/2*L \qquad (2)$$

wherein $\mu$ is the carrier mobility, Cox is the capacitance of a gate oxidation film. W is a channel width, and L is a channel length. It can be seen from the equations (1) and (2) that, by varying the channel length L of a MOS transistor, it is possible to vary Its gain coefficient β and Vref and therefore change Vint.

Figure 4:
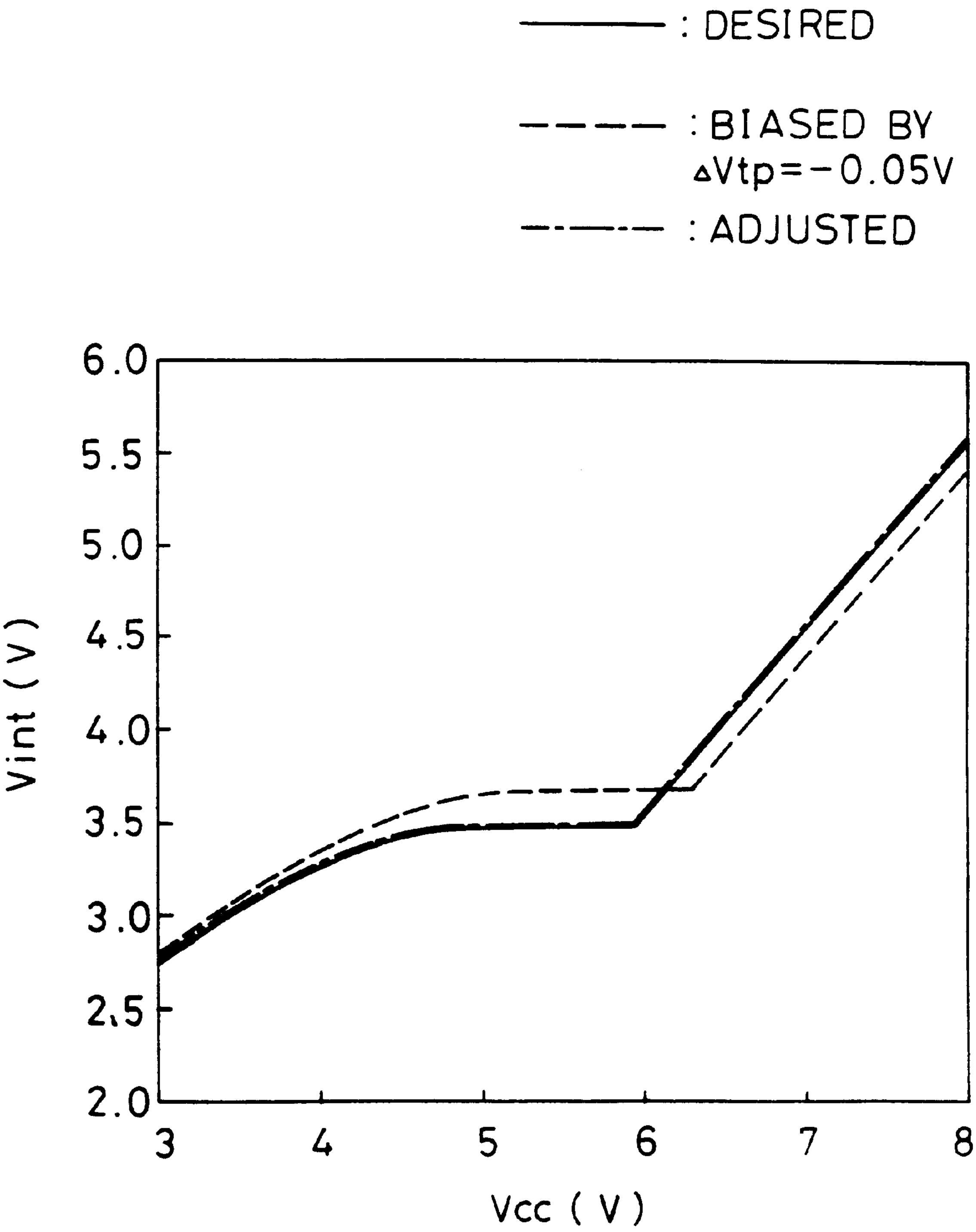
FIG. 4 is a characteristic graph illustrating a process of adjusting the internal reduced voltage from the circuit of FIG. 1.

Next, it will be described with reference to FIG. 4 that Vref and Vrefbi can be corrected simultaneously by cutting off a fuse. FIG. 4 is a graph showing the dependency of Vint on the external power-supply voltage which was plotted for illustrating the process of adjusting Vint. In the drawing, the dependencies of Vint on VCC in three cases where Vtp (the threshold voltage of a p-type MOS transistor) is a fixed value, where Vtp deviates from its fixed value by −0.05 V, and where Vref and Vrefbi are simultaneously corrected by cutting off a fuse so as to adjust Vint are represented by a solid line, broken line, and dash-dot line, respectively.

In the case where Vtp becomes 0.05 V lower than its fixed value, Vint becomes higher than its fixed value in the range in which VCC is lower than 6 V, whereas Vint becomes lower than its fixed value in the range VCC is 6 V or higher. In this case, some out of the five fuses F5 to F9 for Qn10 of FIG. 2 are cut out so as to equivalently increase the gate length of Qn10 and to decrease the drain current Idn10 thereof. The number of fuses to be cut is determined by the amount of correction required. Consequently, Vrefbi becomes higher, and the drain current Idp13 of Qp13, which uses Vrefbi as the gate Input, is reduced simultaneously, thereby lowering Vref. That is, the characteristic of the broken line of FIG. 4 is corrected to the characteristic of the dash-dot line, which is similar to the characteristic of the solid line.

Conversely, in the case where Vtp becomes higher than its fixed value, Vint becomes lower than its fixed value in the range in which VCC is lower than 6 V, whereas Vint becomes higher than its fixed value in the range in which VCC is 6 V or higher, though the drawing thereof is omitted here. In this case, some out of the five fuses F0 to F4 for Qp16 of FIG. 2 are cut out so as to equivalently increase the gate length of Qp16 and to decrease the drain current Idp10 thereof. The number of fuses to be cut is determined by the amount of correction required. Consequently, Vrefbi becomes higher, and the drain current Idn10 of Qn10, which uses Vrefbi as the gate input, is reduced simultaneously, thereby lowering Vref. In this case also, Vref and Vrefbi can be corrected simultaneously by cutting off a fuse, thereby realizing the desired characteristic which is similar to the characteristic of the solid line of FIG. 4.

As described above, according to the present invention, Vref and Vrefbi, which are related to each other, are generated by the single reference voltage generator 10 so that the internal reduced-voltage generator 20 generates Vint based on the higher one of Vref and Vrefbi. Accordingly, the power consumption and layout area of the internal reduced-voltage generator is reduced, unlike the prior art which is provided with the two independent reference voltage generators for the normal operation and for the burn-in acceleration test, respectively. Moreover, since the trimmer, which is so constituted as to adjust Vref and Vrefbi simultaneously, is used in the reference voltage generator 10, the layout area of the trimmer can accordingly be reduced, unlike the prior art which is provided with the two different trimmers for the normal operation and for the burn-in acceleration test, respectively. Furthermore, since there exists no path that allows a constant current to flow between the external power supply and ground in the trimmer of the present embodiment, the power consumption of the internal reduced-voltage generator is further reduced.

Instead of the method of regulating the channel length mentioned above, it is also possible to adopt a method of regulating the channel width W. Concretely, the number of MOS transistors connected in parallel is changed. Instead of the method of cutting off a fuse mentioned above, it is also possible to change the number of MOS transistors connected in series or in parallel on the basis of a decode signal.

In the DRAM, a charge is stored on the electrostatic capacity of its memory cell, so that data is stored therein depending on the presence or absence of the charge. In the normal operation of the DRAM, a voltage for writing data in the memory cell is supplied by a sense amplifier. The DRAM is also internally provided with a peripheral circuit for writing and reading data in and out of the DRAM and for satisfactorily performing other functions. According to the present embodiment, the same Vint is supplied from the internal reduced-voltage generator 20 to the sense amplifier and to the peripheral circuit in the DRAM. In order to ensure the reliability of the capacitance of the oxidation film in the memory cell, Vint, which is the reduced VCC, is supplied to the sense amplifier. Also in order to ensure the reliability and reduce the power consumption of the peripheral circuit, while the internal elements are becoming increasingly smaller in size, Vint, which is the reduced VCC, is supplied to the peripheral circuit.

In order to increase the operating speed of the peripheral circuit and to ensure the reliability of the memory cell in the normal operation of the DRAM, it becomes necessary to maintain the supply voltage to the sense amplifier lower than the supply voltage to the peripheral circuit. For example, in the case where VCC is 5 V, a first internal reduced voltage Vint1 of 4 V and a second internal reduced voltage Vint2 of 3.3 V are supplied to the peripheral circuit and to the sense amplifier, respectively. According to the present embodiment, two internal reduced-voltage generators, each of which has the structure shown in FIG. 1, are mounted in the DRAM, so that Vint1 is outputted from one internal reduced-voltage generator while Vint2 is outputted from the other internal reduced-voltage generator.

EXAMPLE 2

Figure 5:
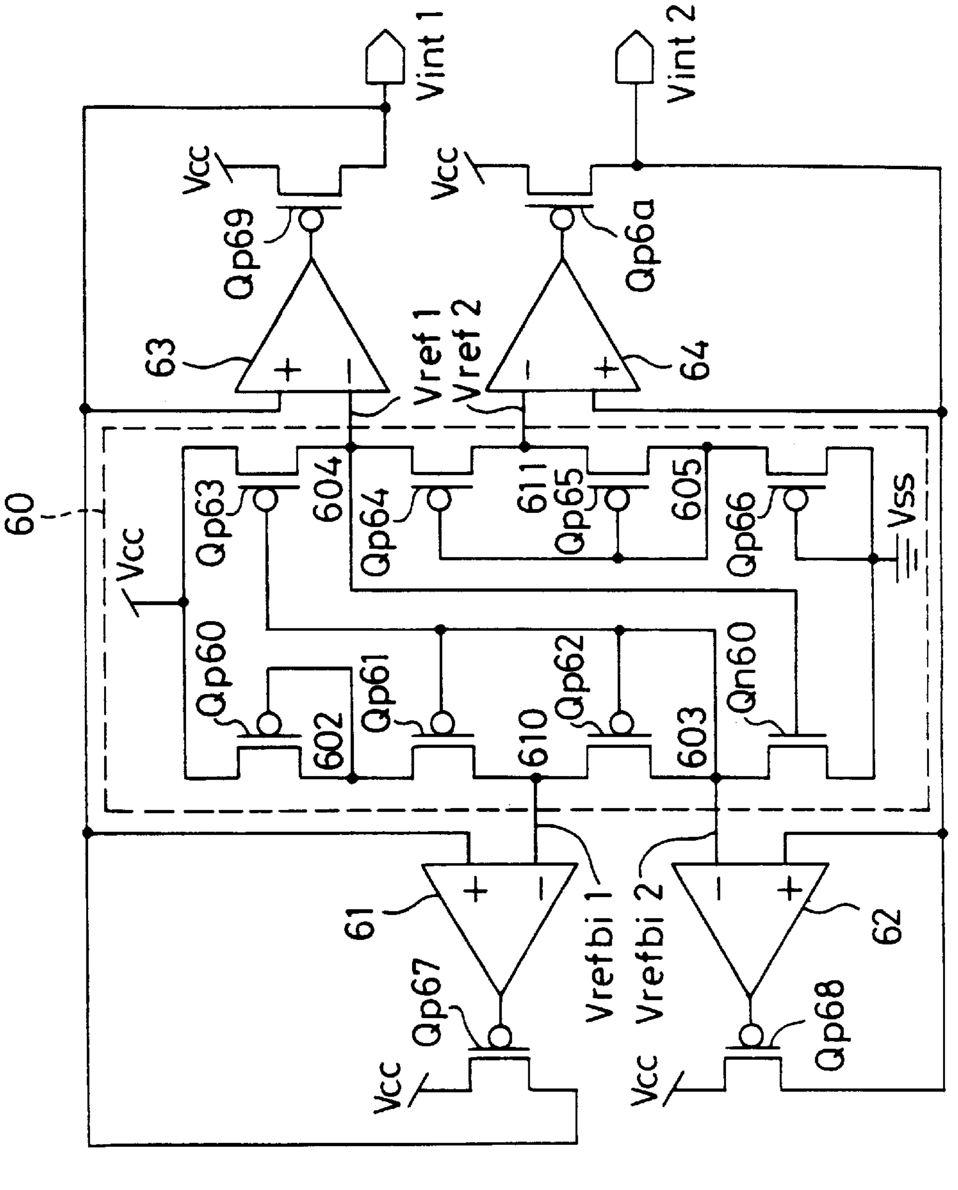
FIG. 5 is a circuit diagram of the internal reduced-voltage generator according to a second embodiment of the present invention.

According to a second embodiment, the two different internal reduced voltages Vint1 and Vint2 are outputted from single internal reduced-voltage generator. FIG. 5 is a circuit diagram of an internal reduced-voltage generator for a DRAM according to the second embodiment of the present invention. In the drawing, an internal reduced-voltage generator 30 is for outputting the two internal reduced voltages Vint1 and Vint2 and comprises a reference voltage generator 60, four differential amplifiers 61 to 64, and four p-type MOS transistors Qp67, Qp68, Qp69, and Qp6a as output drivers. For the first internal reduced voltage Vint1, the reference voltage generator 60 generates a reference voltage Vref1 (first reference voltage) for use in the normal operation and a reference voltage Vrefbi1 (second reference voltage) for use in the burn-in acceleration test. For the second internal reduced voltage Vint2, the reference voltage generator 60 also generates a reference voltage Vref2(third reference voltage) for use in the normal operation and a reference voltage Vrefbi2 (fourth reference voltage) for use in the burn-in acceleration test. A first differential amplifier 61 uses Vrefbi1 as the first input and Vint1 as the second input. The second differential amplifier 62 uses Vrefbi2 as the first input and Vint2 as the second input. The third differential amplifier uses Vref1 as the first input and Vint1 as the second input. The fourth differential amplifier 64 uses Vref2 as the first input and Vint2 as the second input. The gates of Qp67, Qp68, Qp69, and Qp6a are controlled by the outputs of the first, second, third, and fourth differential amplifiers 61, 62, 63, and 64, respectively.

The reference voltage generator 60 is of CMOS structure for generating Vref1 and Vref2, which are less dependent on VCC, and Vrefbi1 and Vrefbi2, which are dependent on VCC. Specifically, in a direction from VSS to VCC, four p-type MOS transistors Qp66, Qp65, Qp64, and Qp63 are disposed in series so as to generate Vref1 and Vref2, which are independent of VCC but dependent on VSS. Conversely, in a direction from VCC to VSS, three p-type MOS transistors Qp60, Qp61, and Qp62 and a n-type MOS transistor Qn60 are disposed in series so as to generate Vrefbi1 and Vrefbi2, which are independent of VSS but dependent on VCC. Each of Qp60, Qp62, Qp65, and Qp66 forms a diode which has its gate and drain short-circuited. The gate of Qn60 and the source of Qp64 are also short-circuited, while the gate of Qp64 and the drain of Qp65 are short-circuited. That is, the reference voltage generator 60 is constituted in such a manner that Qp11 and Qp14 in the reference voltage generator 10 of FIG. 1 are replaced by a pair of Qp61 and Qp62 and by a pair of Qp64 and Qp65, respectively. Each of Qp60, Qp61, Qp62, Qp63, Qp64, Qp65, Qp66, and Qn60 is operated in a saturation region. In the drawing, 610 represents a node for outputting Vrefbi1, 603 represents a node for outputting Vrefbi2, 604 represents a ode for outputting Vref1, 611 represents a node for outputting Vref2, 602 represents a node for connecting Qp60 and Qp61, and 605 represents a node for connecting Qp65 and Qp66.

Below, the principle of the operation of the reference voltage generator 60 will be described briefly. Provided that Vref1 is substantially constant, the gate potential of Qn60, which is operated in the saturation region, is a constant value Vref1 and its source voltage is VSS. Therefore, the gate-source voltage of Qn60 is kept substantially constant, with the result that Qn60 is operated as a constant current source and the drain current Idn60 of Qn60 is kept substantially constant. The drain potential of Qp62 (equal to the gate potential thereof) when the respective drain currents Idp60, Idp61, Idp62, and Idn60 of Qp60, Qp61, Qp62, and Qn60 are the same serves as Vrefbi2 in a stable state. Consequently, Idp60, Idp61, and Idp62 in the stable state are substantially constant. On the other hand, since each of Qp60, Qp61, and Qp62 is operated in the saturation region, Idp60, Idp61, and Idp63 are practically determined by the gate-source voltages of their corresponding transistors. When Idp60, Idp61, and Idp62 are substantially constant, as described above, the gate-source voltage of each of Qp60, Qp61, and Qp62 is also kept substantially constant. From the foregoing, it can be concluded that the potential difference between Vrefbi2 and VCC (equal to the potential difference between the source of Qp60 and the gate of Qp61) is substantially constant. Since Idp61 is independent of VCC and constant, the potential difference between Vrefbi1 and VCC is also substantially constant.

Since the gate-source voltage of Qp63 equals to the potential difference between Vrefbi2 and VCC and hence is substantially constant, Qp63 being operated in the saturation region serves as a constant current source. Consequently, the drain current Idp63 of Qp63 is kept substantially constant even when VCC is varied. The source potential of Qp64 when the respective drain currents Idp63, Idp64, Idp65, and Idp66 of Qp63, Qp84, Qp65, and Qp66 are the same serves as Vref1 in the stable state. Therefore, Idp64, Idp65, and Idp66 in the stable state are substantially constant. On the other hand, since each of Qp64, Qp65, and Qp66 is operated in the saturation region, Idp64, Idp65, and Idp66 are practically determined by the gate-source voltages of their corresponding transistors. When Idp64, Idp65, and Idp66 are substantially constant, as described above, the gate-source voltages of Qp64, Qp65, and Qp66 are also kept substantially constant. From the foregoing, it can be concluded that the potential difference between Vref1 and VSS (equal to the potential difference between the source of Qp64 and the gate of Qp66) is substantially constant and that the potential difference between Vref2 and VSS (equal to the potential difference between the source of Qp65 and the gate of Qp66) is substantially constant.

As described above, in the reference voltage generator 60 of the feedback structure shown in FIG. 5, Vrefbi1 and Vrefbi2 are lower than VCC by specified potential differences, respectively, so as to serve as constant reference voltages which are independent of VSS but dependent on VCC. Conversely, Vref1 and Vref2 are higher than VSS by specified potential differences, respectively, so as to serve as constant reference voltages which are independent of VCC but dependent on VSS. The relationship between Vrefbi1 and Vrefbi2 and the relationship between Vref1 and Vref2 are: Vrefbi1 >Vrefbi2 and Vref1>Vref2.

According to the structure of the internal reduced-voltage generator 30 of FIG. 5, Vint1 is increased to the higher value of Vref1 and Vrefbi1 by the operations of the first and third differential amplifiers 61 and 63 and of Qp67 and Qp69. Similarly, Vint2 is increased to the higher value of Vref2 and Vrefbi2 by the operations of the second and fourth differential amplifiers 62 and 64 and of Qp68 and Qp6a.

Figure 6:
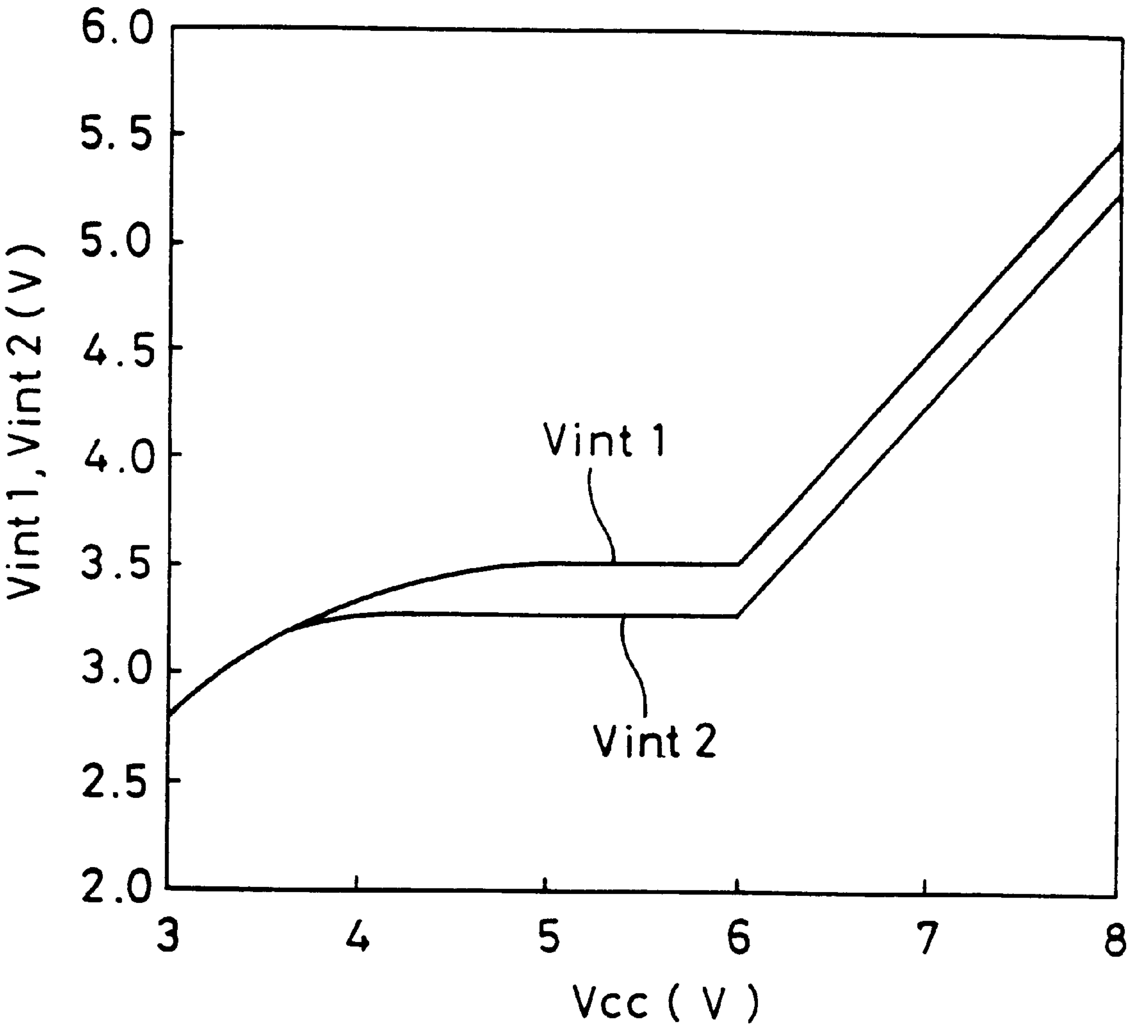
FIG. 6 is a characteristic graph showing the dependencies of two internal reduced voltages from the circuit of FIG. 5 on the external power-supply voltage.

FIG. 6 is a graph showing the dependency of Vint1 and Vint2 on the external power-supply voltage in the above-mentioned internal reduced-voltage generator 30 of FIG. 5. Similarly to the case of FIG. 3, each of Vint1 and Vint2 is independent of VCC in the range in which VCC is lower than 6 V. In the range in which VCC is 6 V or higher, each of Vint1and Vint2 becomes a high voltage which is dependent on VCC and which is capable of applying stress to the internal elements. The relationship between Vint1 and Vint2 is: Vint1 >Vint2. The correction of Vint1 and Vint2 can be achieved by operating a fuse ROM, which is similar to that shown in FIG. 2.

Figure 7:
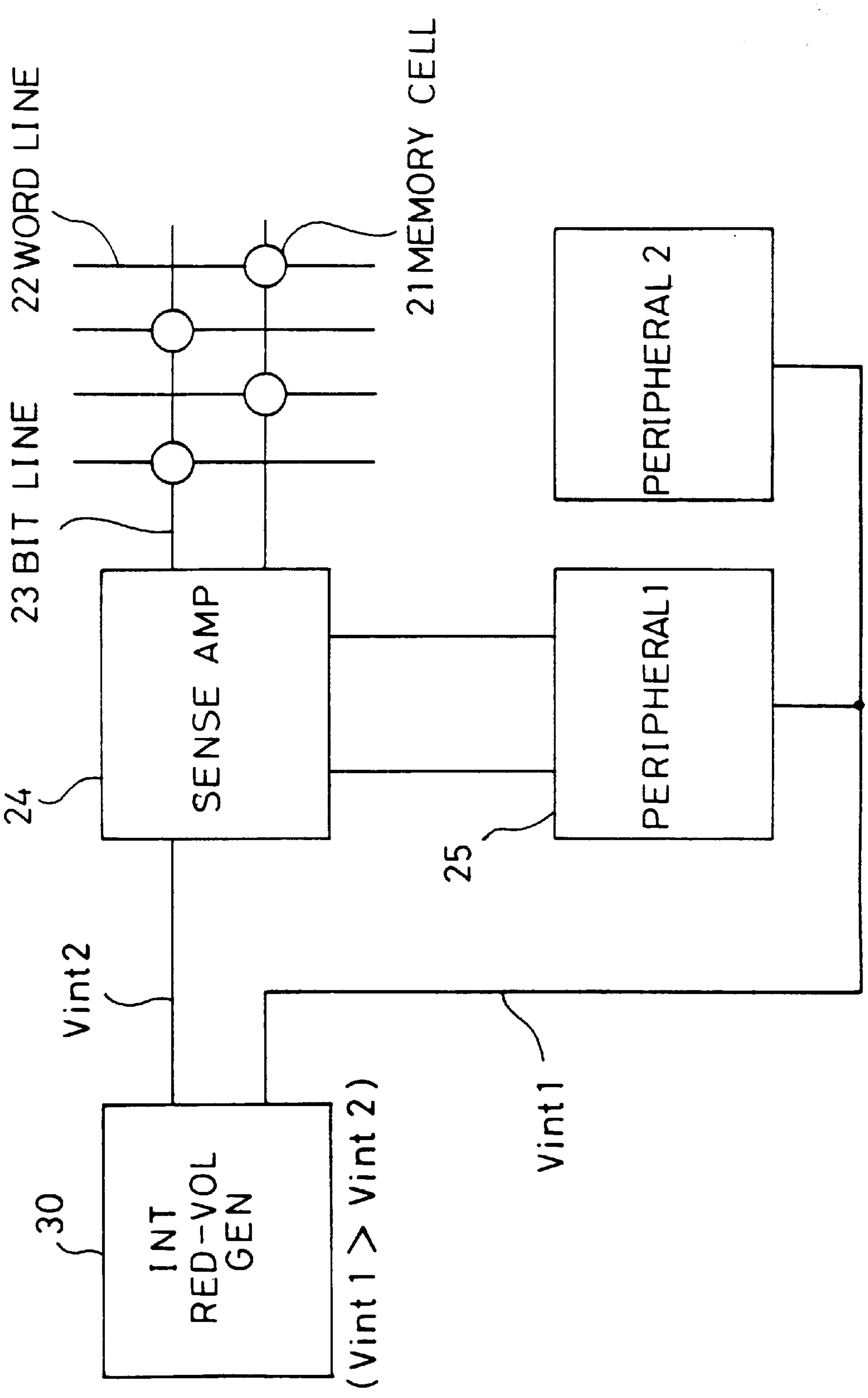
FIG. 7 is a block diagram of a DRAM in which is mounted the internal reduced-voltage generator of FIG. 5.

FIG. 7 is a block diagram of a DRAM in which the internal reduced-voltage generator 30 of the structure shown in FIG. 5 is mounted. In the drawing, 21 denotes a memory cell, 22 denotes a word line, 23 denotes a bit line, 24 denotes a sense amplifier for supplying to the memory cell a voltage for writing data therein, and 25 denotes other peripheral circuits. The internal reduced-voltage generator 30 supplies Vint1 to the peripheral circuits 25 as well as supplies Vint2, which is lower than Vint1, to the sense amplifier 24. This increases the operating speed of the peripheral circuits 25 in the normal operation of the DRAM and ensures the reliability of the capacitance of the oxidation film of the memory cell 21.

Thus, according to the present embodiment, two different internal reduced voltages Vint1 and Vint2 can be outputted from the single internal reduced-voltage generator 30. Compared to the case in which two internal reduced-voltage generators, each having the structure of FIG. 1, are mounted in the DRAM so that one generator outputs Vint1 and the other generator outputs Vint2, the power consumption and layout area of the internal reduced-voltage generator is reduced.

The structure of FIG. 5 will easily be expanded, by those skilled in the art, into a structure in which three or more internal reduced voltages are generated.

EXAMPLE 3

According to a third embodiment, either of the two different internal reduced voltages Vint1 and Vint2(Vint1 >Vint2) can selectively be generated from a single internal reduced-voltage generator.

Figure 8:
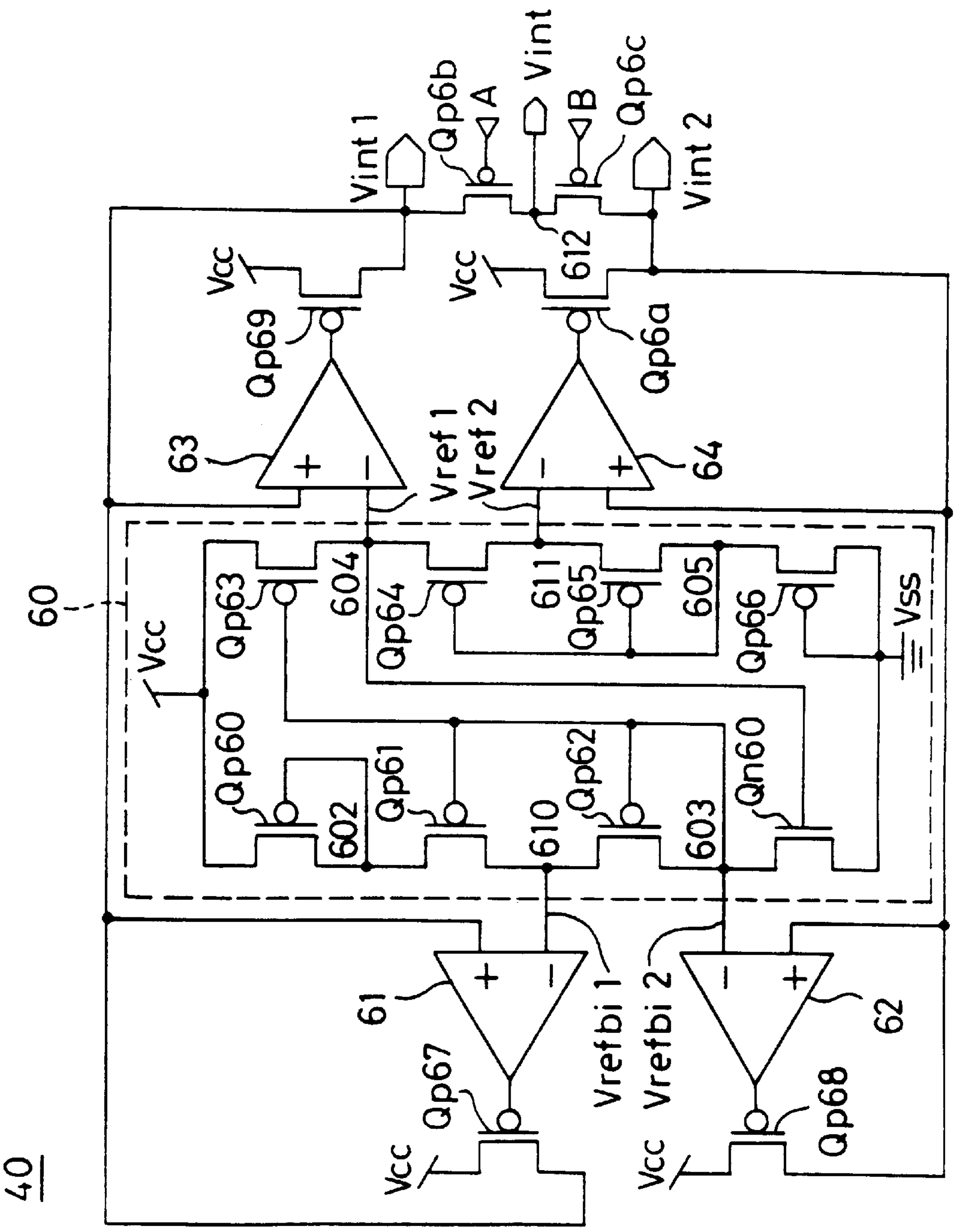
FIG. 8 is a circuit diagram of the internal reduced-voltage generator according to a third embodiment of the present invention.

FIG. 8 is a circuit diagram of an internal reduced-voltage generator for use in a DRAM according to the third embodiment of the present invention. In the drawing, an internal reduced-voltage generator 40 is for selectively outputting either Vint1 or Vint2 as an internal reduced voltage Vint. The internal reduced-voltage generator 40 is obtained by adding two p-type MOS transistors Qp6b and Qp6c to the structure of FIG. 5. The two transistors Qp6b and Qp6c are disposed in series in a direction from Vint1 to Vint2. The gates of Qp6b and Qp6c are controlled by a first control signal A and a second control signal B, respectively. Here, 612 denotes a node for connecting Qp6b and Qp6c and for outputting Vint.

In the internal reduced-voltage generator 40 of FIG. 8, Qp6b is turned on and Qp6c is turned off by setting the first control signal A to the low level and the second control signal B to the high level. In this case, Vint generated from the internal reduced-voltage generator 40 becomes equal to Vint1. Conversely, Qp6b is turned off and Qp6c is turned on by setting the first control signal A to the high level and the second control signal B to the low level, with the result that Vint becomes equal to Vint2. That is, according to the present embodiment, it is possible to arbitrarily select the voltage Vint to be outputted from between Vint1and Vint2, each having the dependency on the external power supply voltage shown in FIG. 6.

Figure 9:
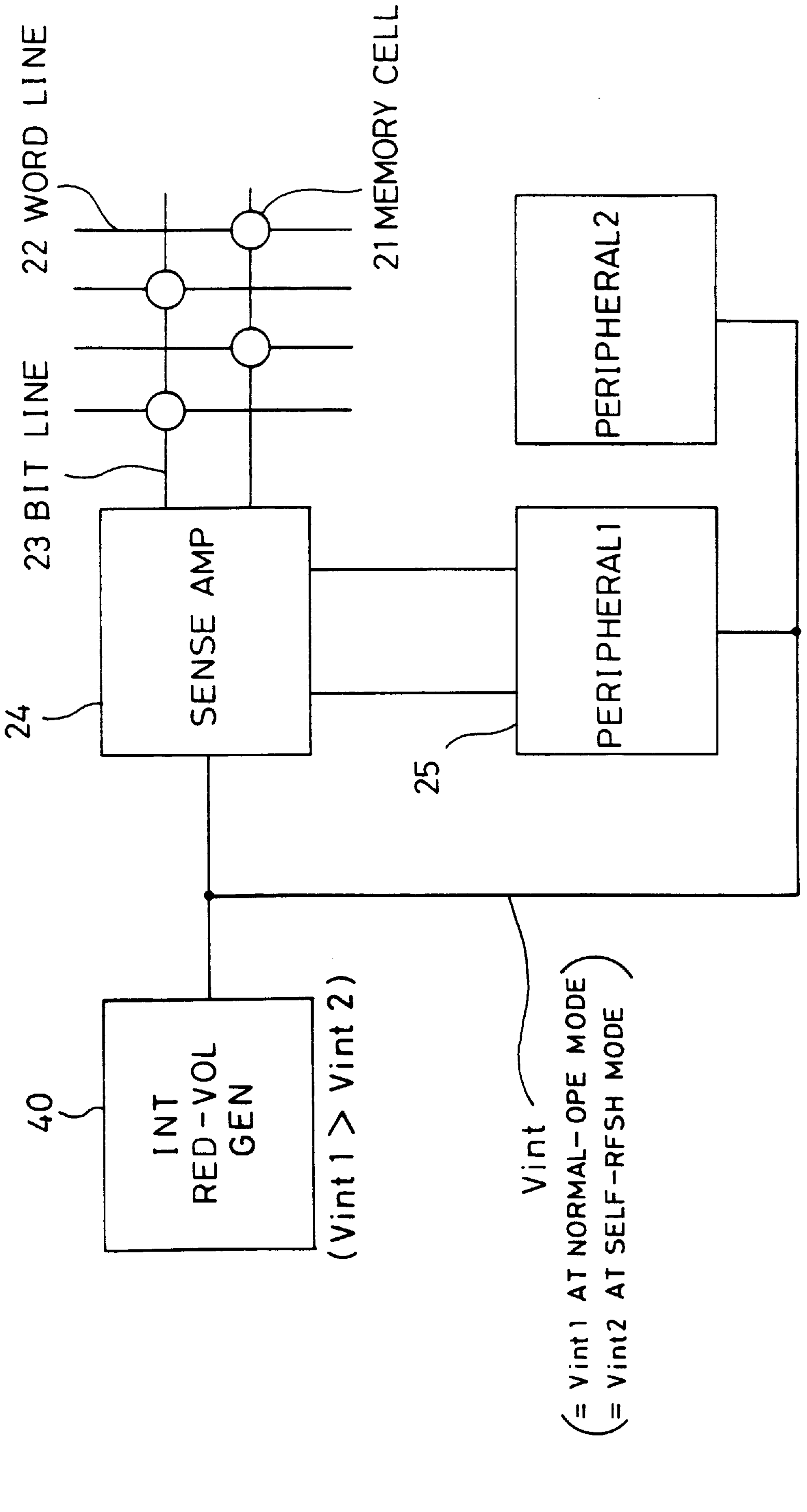
FIG. 9 is a block diagram of a DRAM in which is mounted the internal reduced-voltage generator of FIG. 8.

FIG. 9 is a block diagram of a DRAM in which the internal reduced-voltage generator 40 having the structure of FIG. 8 is mounted. The internal reduced-voltage generator 40 supplies Vint in common to the sense amplifier 24 and peripheral circuits 25. In the normal operation mode of the DRAM, Vint1 is selected as Vint, while Vint2, which is lower than Vint1, is selected as Vint in the self-refreshment mode.

In the normal operation, Vint1, which is higher than Vint2, is supplied by the internal reduced-voltage generator 40 to the sense amplifier 24 and to the peripheral circuits 25, thereby ensuring the high-speed operation of the internal circuit of the DRAM in writing and reading data in and out of the DRAM. By increasing VCC to 6 V or higher, it is also possible to perform the burn-in acceleration test on the DRAM with the use of Vint.

During the battery back up which does not require the high-speed operation of the internal circuit, particularly in the self-refreshment mode, Vint2 which is lower than Vint1 is supplied by the internal reduced-voltage generator 40 to the sense amplifier 24 and to the peripheral circuits 25, thereby reducing the power consumption of the DRAM while retaining the stored data. More specifically, not only the power consumption in the refreshing operation, but also the power consumption in the standby time, during which the refreshing operation is not performed, can be reduced.

In FIG. 9, the supply voltage Vint to the sense amplifier 24 serves as the voltage for writing data in the memory cell 21, as described above. The amount of the charge stored as data in the capacitor of the memory cell 21 depends on the magnitude of Vint. If the amount of the charge stored in the capacitor of the memory cell 21 is varied, the period during which the data is retained is also varied, so that the interval between the refreshing operations (refresh overhead time) is varied. The problem will be solved in a fourth embodiment, which will be described below.

EXAMPLE 4

According to a fourth embodiment, the variations of the supply voltage to the sense amplifier in a DRAM is prevented.

Figure 10:
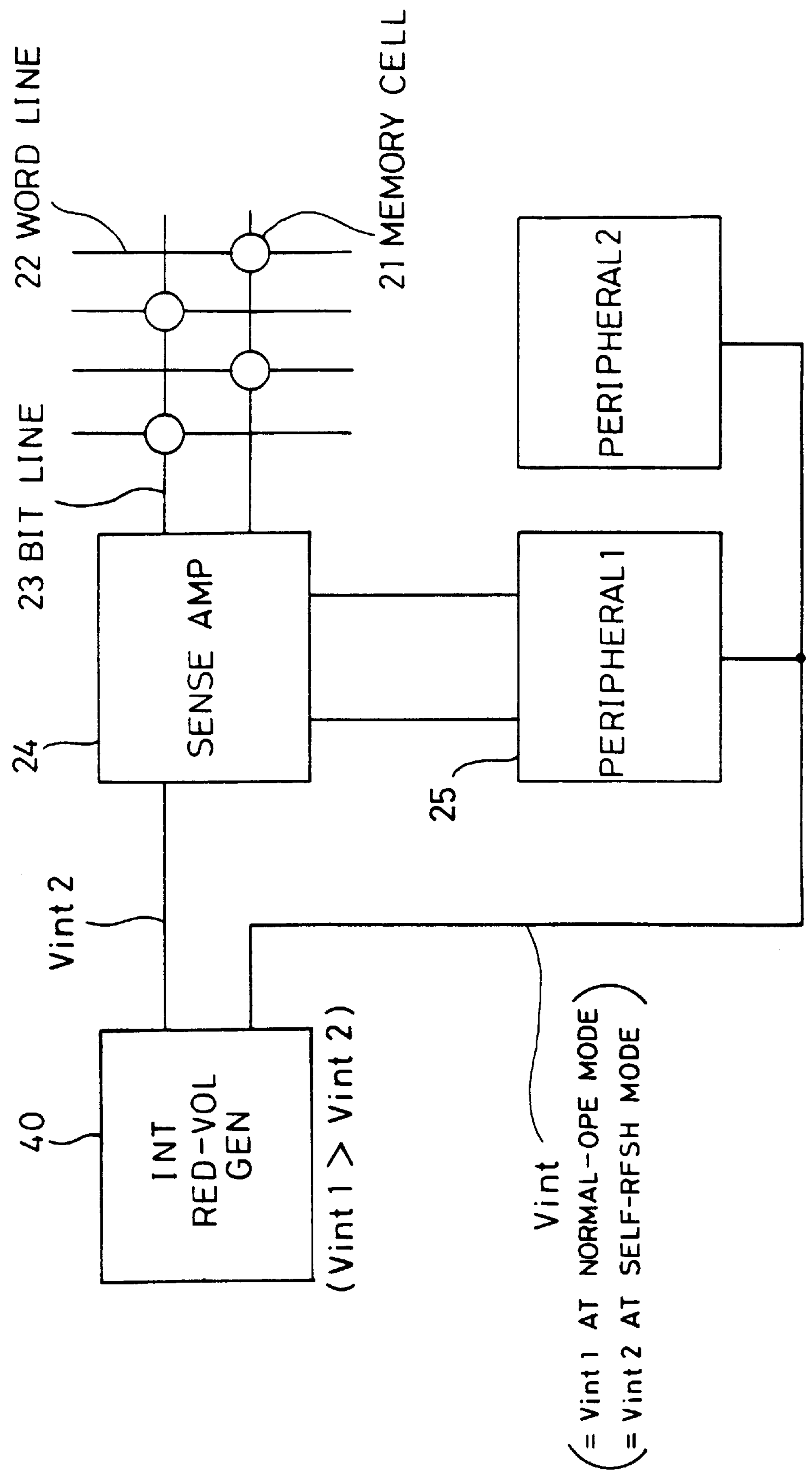
FIG. 10 is a block diagram of a DRAM in which is mounted the internal reduced-voltage generator according to a fourth embodiment of the present invention.

FIG. 10 is a block diagram of a DRAM in which an internal reduced-voltage generator according to the fourth embodiment of the present invention is mounted. The inner structure of an internal reduced-voltage generator 40 of FIG. 10 is shown in FIG. 8. The internal reduced-voltage generator 40 supplies Vint to the peripheral circuits 25 while supplying Vint2 to the sense amplifier 24.

Similarly to the third embodiment, Vint supplied to the peripheral circuits 25 from the internal reduced-voltage generator 40 is Vint1 in the normal operation mode of the DRAM and is Vint2, which is lower than Vint1, in the self-refreshment mode. However, unlike the case of the third embodiment, Vint2 is constantly supplied to the sense amplifier 24 both in the normal operation mode and in the self-refreshment mode.

According to the present embodiment, by lowering the supply voltage Vint to the peripheral circuits 25 in the self-refreshment operation, the power consumption of the DRAM can be reduced without deteriorating the data retention property of the memory cell 21. Concretely, in the fourth embodiment, the power consumption during the battery back up of the DRAM (mean value of the power consumption during refreshment and the power consumption during standby) is 79 μA. Compared with 101 μA in the second embodiment (FIG. 7), the power consumption during the battery back up of the DRAM is reduced by approximately 22%.

It is possible to provide in the DRAM another internal reduced-voltage generator exclusively for the sense amplifier, while using the internal reduced-voltage generator 40 for peripheral circuits. In this case, the lower output voltage Vint2 from the internal reduced-voltage generator 40 can be differentiated from the output voltage from the internal reduced-voltage generator exclusively for the sense amplifier.

Figure 11:
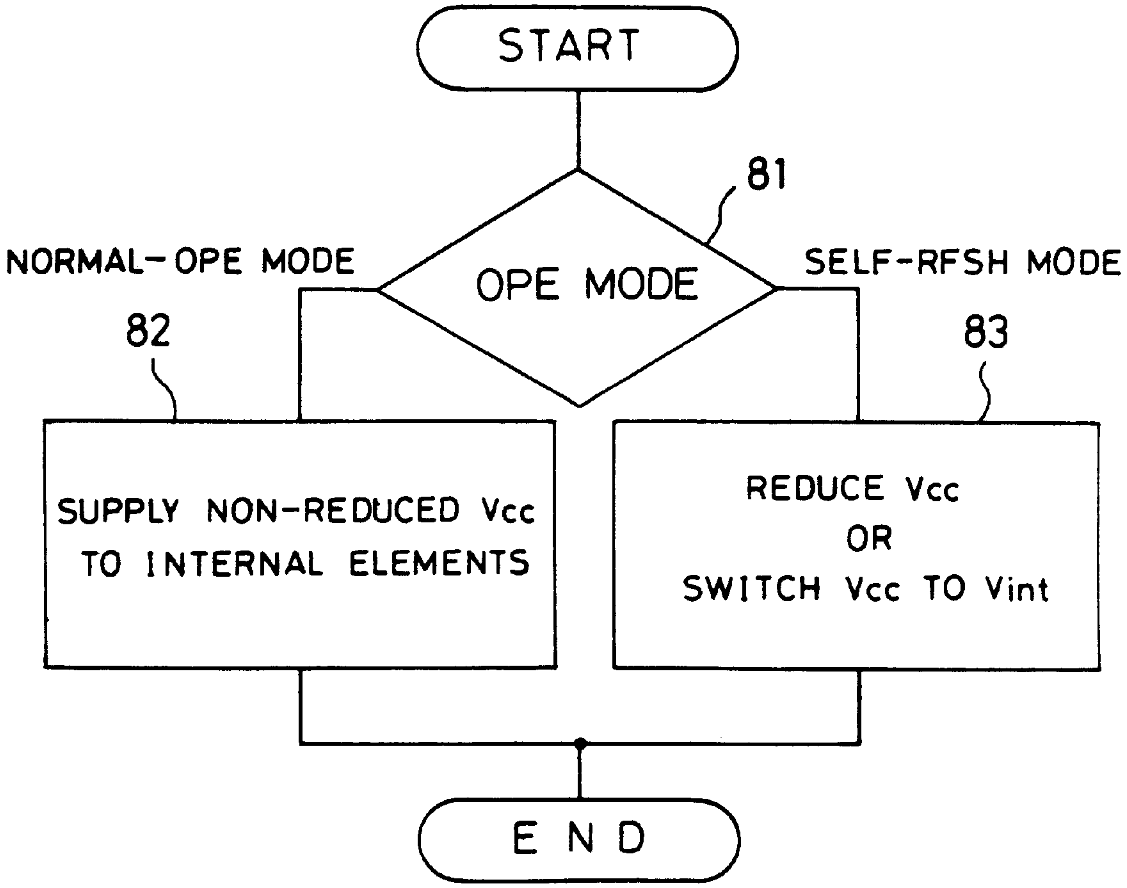
FIG. 11 is a flow chart showing, by way of example, a method of switching the supply voltage to the internal elements of a DRAM according to the present invention.

It is also possible to switch the supply voltage to the internal elements (particularly components of peripheral circuits) of the DRAM in the manner shown in FIG. 11. In FIG. 11, it is judged whether the mode to be adopted is the normal operation mode or the self-refreshment mode in Step 81. In the case where a CAS (column address strobe) is fallen after the falling of a RAS (row address strobe), it is judged that the mode to be adopted is the normal operation mode. On the contrary, in the case where the RAS is fallen after the falling of the CAS and a specified period of time has passed after the falling of the RAS, it is Judged that the mode to be adopted is the self-refreshment mode. In the case of the normal operation mode, the external power-supply voltage VCC is supplied to the internal elements of the DRAM in Step 82, without being reduced. In the case of the self-refreshment mode, the external power-supply voltage VCC, which is the supply voltage to the internal elements in the normal operation, is reduced in Step 83. Instead of reducing VCC, it is also possible to switch the power supply voltage to the internal elements from VCC to the output Vint of the internal reduced-voltage generator (e.g., having the structure of FIG. 1).

In the foregoing embodiments, there has been described the internal reduced-voltage generator to be mounted in a DRAM. However, the internal reduced-voltage generator according to the present invention is also applicable to other types of semiconductor integrated circuits. For example, it is possible to apply the internal reduced-voltage generator according to the present invention to the power supply circuit for reading data out of an EEPROM.

We claim:

1. A semiconductor integrated circuit, comprising:

at least one memory cell;

an internal reduced-voltage generator for generating first and second internal reduced voltages that are different from each other;

a first internal circuit that is driven by the higher one of said first and second internal reduced voltages in a normal operation mode and that is driven by the lower one of said first and second internal reduced voltages in a self-refreshment mode; and a second internal circuit that is driven by the lower one of said first and second internal reduced voltages in a normal operation mode and in a self-refreshment mode for writing data to a memory cell;

wherein in said normal operation mode, only said first internal circuit is driven by the higher one of said first and second internal reduced voltages, and wherein in said self-refreshment mode, said first and second internal circuits are driven by the lower one of said first and second internal reduced voltages, thereby reducing power while writing data to said memory cell.

2. The semiconductor integrated circuit of claim 1, wherein said first internal circuit includes a peripheral circuit and said second internal circuit includes a sense amplifier.

3. A semiconductor integrated circuit device comprising:

an internal circuit comprising at least one memory cell; and an internal reduced voltage generator for generating internal reduced voltages from an external power supply voltage supplied to said internal reduced voltage generator, said internal reduced voltage generator comprising a reference voltage generator for generating reference voltages, said reference voltage generator comprising a current source and means for generating a first reference voltage and a second reference voltage from a current supplied by said current source in such a manner that said first reference voltage is substantially constant and that said second reference voltage is substantially constant and lower than said first reference voltage, said internal reduced voltage generator supplying:

a first internal reduced voltage based on said first reference voltage to said internal circuit in response to a signal indicative of a first operating mode for normal operation, the level of said first internal reduced voltage being constant, independent of a level variation of said external power supply voltage, and lower than the level of said external power supply voltage, and a second internal reduced voltage based on said second reference voltage to said internal circuit in response to a signal indicative of a second operating mode for retaining the data stored in said at least one memory cell, the level of said second internal reduced voltage being:

constant, independent of a level variation of said external power supply voltage, lower than the level of said external power supply voltage, and lower than the level of said first internal reduced voltage.

4. The semiconductor integrated circuit device of claim 3, wherein each of said internal reduced voltages is derived from an end of a current path of a MOS transistor, the other end of said current path being coupled to said external power supply voltage.

5. The semiconductor integrated circuit device of claim 4, wherein said MOS transistor is controlled by a comparing means for comparing each of said internal reduced voltages with corresponding one of said first reference voltage and said second reference voltage.

6. The semiconductor integrated circuit device of claim 3, wherein said at least one memory cell is a dynamic random access memory and said second operating mode is a self-refreshment mode.

7. The semiconductor integrated circuit device of claim 3, wherein said reference voltage generator further comprising means for generating a third reference voltage and a fourth reference voltage, each of said third and fourth reference voltages being lower than said external power supply voltage by a specified amount, and said reduced voltage generator further supplying:

a third internal reduced voltage based on said third reference voltage in response to a signal indicative of said first operating mode when said third reference voltage is higher than said first reference voltage, and a fourth internal reduced voltage based on said fourth reference voltage in response to a signal indicative of said second operating mode when said fourth reference voltage is higher than said second reference voltage.

* * * * *